(12) United States Patent
Sauer et al.

(10) Patent No.: US 10,436,221 B2
(45) Date of Patent: Oct. 8, 2019

(54) FAN GUARD WITH FLEXIBLE COMPRESSION MEMBER

(71) Applicant: HEWLETT PACKARD ENTERPRISE DEVELOPMENT LP, Houston, TX (US)

(72) Inventors: Keith A Sauer, Spring, TX (US); Joseph Oliver, Magnolia, TX (US); James J Schulze, The Woodlands, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 485 days.

(21) Appl. No.: 14/626,317

(22) Filed: Feb. 19, 2015

(65) Prior Publication Data
US 2016/0245307 A1    Aug. 25, 2016

(51) Int. Cl.
*H02K 5/22* (2006.01)
*H05K 7/20* (2006.01)
*F04D 29/60* (2006.01)
*F04D 19/00* (2006.01)

(52) U.S. Cl.
CPC ......... *F04D 29/601* (2013.01); *F04D 19/002* (2013.01); *H02K 5/225* (2013.01); *H05K 7/20136* (2013.01); *H05K 7/20172* (2013.01); *F05D 2260/38* (2013.01)

(58) Field of Classification Search
CPC ....... F04D 29/601; F04D 29/60; F16M 13/02; H02K 5/225; H02K 5/04; H02K 5/24; H02K 5/26; H05K 7/20172; H05K 7/202; H05K 7/20136; G06F 1/20; G06F 1/203; G06F 1/206; G06F 1/183
See application file for complete search history.

(56) References Cited

U.S. PATENT DOCUMENTS

| | | | | |
|---|---|---|---|---|
| 5,377,745 A | * | 1/1995 | Hsieh | H01L 23/467 165/121 |
| 5,504,650 A | * | 4/1996 | Katsui | G06F 1/20 165/80.3 |
| 5,559,674 A | * | 9/1996 | Katsui | H01L 23/40 165/121 |
| 5,906,475 A | * | 5/1999 | Melane | F04D 29/601 403/326 |
| 6,611,427 B1 | * | 8/2003 | Liao | F04D 25/166 165/121 |
| 6,788,533 B2 | | 9/2004 | Chen | |

(Continued)

FOREIGN PATENT DOCUMENTS

WO    WO-2016032510 A1 *  3/2016  ............... G06F 1/20

*Primary Examiner* — Julio C. Gonzalez
*Assistant Examiner* — Alexander A Singh
(74) *Attorney, Agent, or Firm* — Nolte Intellectual Property Law Group

(57) ABSTRACT

Example implementations relate to a fan guard device. One example fan guard device includes a frame to receive a fan. The example fan guard device includes a plurality of snaps extending in a first direction from the frame. The snaps engage the fan. The fan guard device includes at least one flexible member extending in the first direction from the frame to engage a flange of the fan. The flexible member may compress and remain in contact with the flange. The amount of compression of the at least one flexible member may accommodate a range of flange thicknesses of the fan.

20 Claims, 4 Drawing Sheets

(56) References Cited

U.S. PATENT DOCUMENTS

| | | |
|---|---|---|
| 7,385,813 B2 | 6/2008 | Lin |
| 7,589,966 B2 | 9/2009 | Ong |
| 7,824,155 B2 | 11/2010 | Chen |
| 8,182,319 B2 | 5/2012 | Ong |
| 2004/0047129 A1* | 3/2004 | Simon ................. H01L 23/4006 361/697 |
| 2007/0003419 A1* | 1/2007 | Wu ....................... F04D 29/601 417/363 |
| 2007/0231157 A1 | 10/2007 | Chuang |
| 2008/0090511 A1* | 4/2008 | Wu ......................... G06F 1/183 454/184 |
| 2009/0021911 A1* | 1/2009 | Lee ....................... F04D 25/166 361/695 |
| 2010/0054920 A1 | 3/2010 | Xu |
| 2012/0113591 A1* | 5/2012 | Chuang .............. H05K 7/20172 361/695 |
| 2014/0029191 A1* | 1/2014 | Terwilliger ............... G06F 1/20 361/679.31 |
| 2014/0205437 A1* | 7/2014 | Zhu ....................... F04D 19/007 415/119 |

* cited by examiner

FAN GUARD WITH FLEXIBLE COMPRESSION MEMBER

BACKGROUND

Fans may be used to provide active cooling of components, such as memory modules and processors, inside a chassis of a computing device. Fans may be used to draw in air outside of a chassis to lower the air temperature inside the chassis. Fans may also be used to expel hot air inside the chassis to lower the air temperature inside the chassis.

BRIEF DESCRIPTION OF THE DRAWINGS

Some examples of the present application are described with respect to the following figures.

DETAILED DESCRIPTION

As described above, fans may be used to provide active cooling of components inside a chassis of a computing device. A fan may be mounted to a chassis using a fan guard. The fan guard may include one or more frames that are attached to flanges of the fan. Once attached to the fans, the frames may secure the fans to pins in the chassis via pin receivers built into the frames.

In various examples, different fan manufacturers may produce fans having differing attributes, including flange depth. This may create complexities for attaching fan guards to the fans. By way of illustration, some fan guards may attempt to ensure secure attachment between the fan guards and fans using, for example, screws. However, using screws to install (or uninstall) fan guards on fans may be a time consuming process. In other examples, fan guards with snaps may provide a quick way to attach fan guards to fans. However, because fans from different manufacturers may have differing flange depths, a one size fits all approach to snaps may not ensure secure attachment of fans to fan guards. This may cause, for example, rattling during operation of the fan. To facilitate secure attachment, some fan guards having snaps may be designed specifically to work with different types of fans. Alternatively, custom spacers made of, for example, foam may be placed over snaps to ensure proper attachment. These customized solutions may increase fan installation expense and/or installation time.

Examples described herein provide a fan guard that includes a flexible member for securely attaching a fan guard frame to the flange of a fan in combination with snaps on the frame. The flexible member may compress backwards into a cavity between the flexible member and the frame depending an the thickness of the flange of the fan. Though a thinner flange may cause less compression in the flexible member than a thicker flange, either size of flange may be securely fastened to the frame due to pressure generated between the snaps and the flexible member. Consequently, a single frame design may operate without customizable spacers facilitating fast installation of the fan guard to the fan, as well as reduced manufacturing costs due to a single part being used, as opposed to multiple types of fan guards and/or custom spacers.

It is appreciated that, in the following description, numerous specific details are set forth to provide a thorough understanding of the examples. However, it is appreciated that the examples may be practiced without limitation to these specific details. In other instances, methods and structures may not be described in detail to avoid unnecessarily obscuring the description of the examples. Also, the examples may be used in combination with each other.

Figure 1:
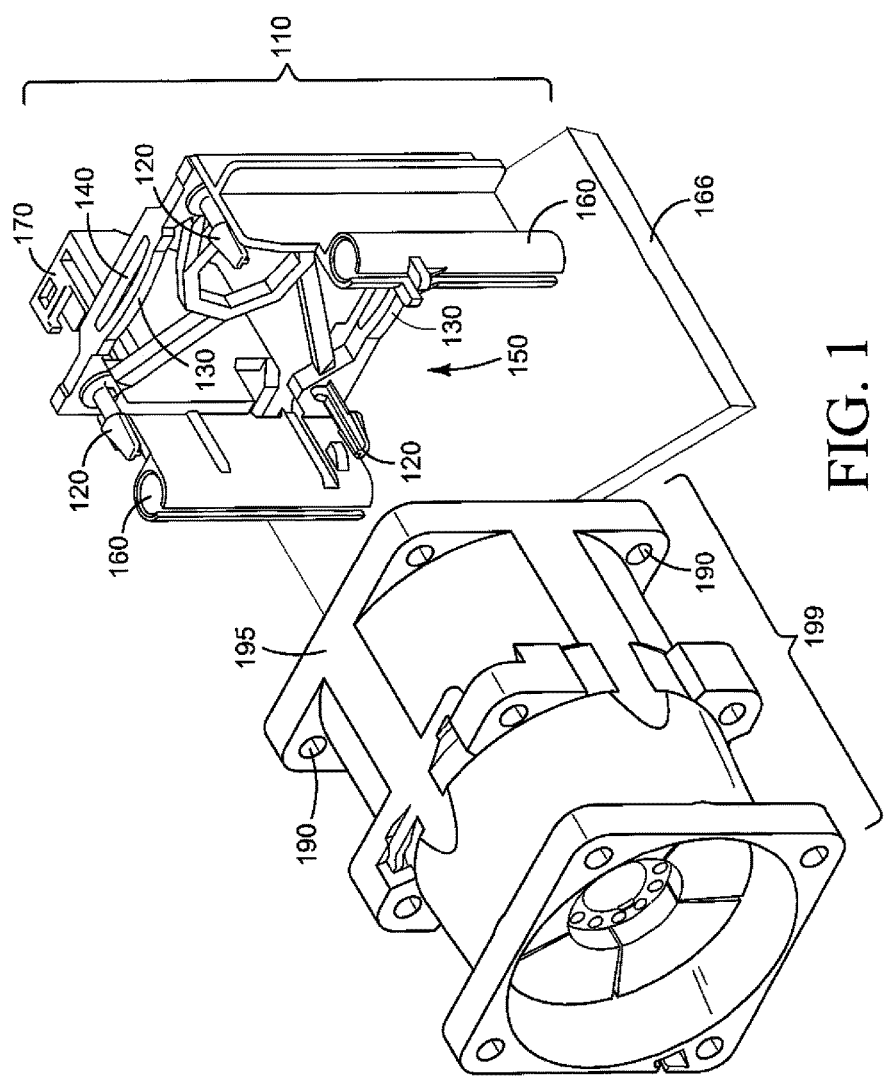
FIG. 1 illustrates an angled view of a fan guard, according to an example.

FIG. 1 illustrates an angled view of a fan guard, according to an example. It should be appreciated that the items depicted in FIG. 1 are illustrative examples and many different features and implementations are possible. The fan guard depicted in FIG. 1 is illustrated in a disengaged position to facilitate showing components of the fan guard and how the fan guard is usable with a fan 199. The fan guard includes a frame 110. Frame 110 may receive fan 199. Specifically, frame 110 may receive a flange 195 of fan 199 into flange receiving region 150. Frame 110 may include a plurality of snaps 120. The plurality of snaps 120 extend in a first direction from frame 110. Fan 199 may have a plurality of snap receivers 190 capable of receiving snaps 120 to facilitate secure connection of frame 110 to fan 199. The plurality of snaps may be designed to engage fan 199.

The fan guard also includes at least one flexible member 130. Flexible member 130 extends in the first direction from frame 110. In various examples, the fan guard may include multiple flexible members 130 disposed across from each other on frame 110. The extension of flexible member 130 from frame 110 creates a space 140 into which flexible member may compress when engaging with flange 195 of fan 199. Consequently, flexible member 130 may compress into space 140 when placed in contact with flange 195 so that snaps 120 can pass through snap receivers 190. In various examples, the amount of compression of flexible member 130 may accommodate a range of thicknesses of flange 195 of fan 199. The amount of compression of flexible member 130 may have a range of ten percent to sixty-five percent. Consequently, compression of flexible member 130 may adjust the depth of flange receiving region 150 to accommodate a variety of potential sizes of flange 195.

In various examples, frame 110 may also include a plurality of pin receivers 160. Pin receivers 160 may be disposed opposite each other on frame 110. Pin receivers 160 may facilitate securely attaching frame 110 and fan 199 to a chassis 166 into which fan 199 is to be placed to provide air cooling. In other examples frame 110 may include an electrical connector housing 170. Electrical connector housing 170 may couple to an electrical connector. The electrical connector may facilitate, for example, providing electrical power to fan 199, controlling operation of fan 199, and so forth.

Figure 2:
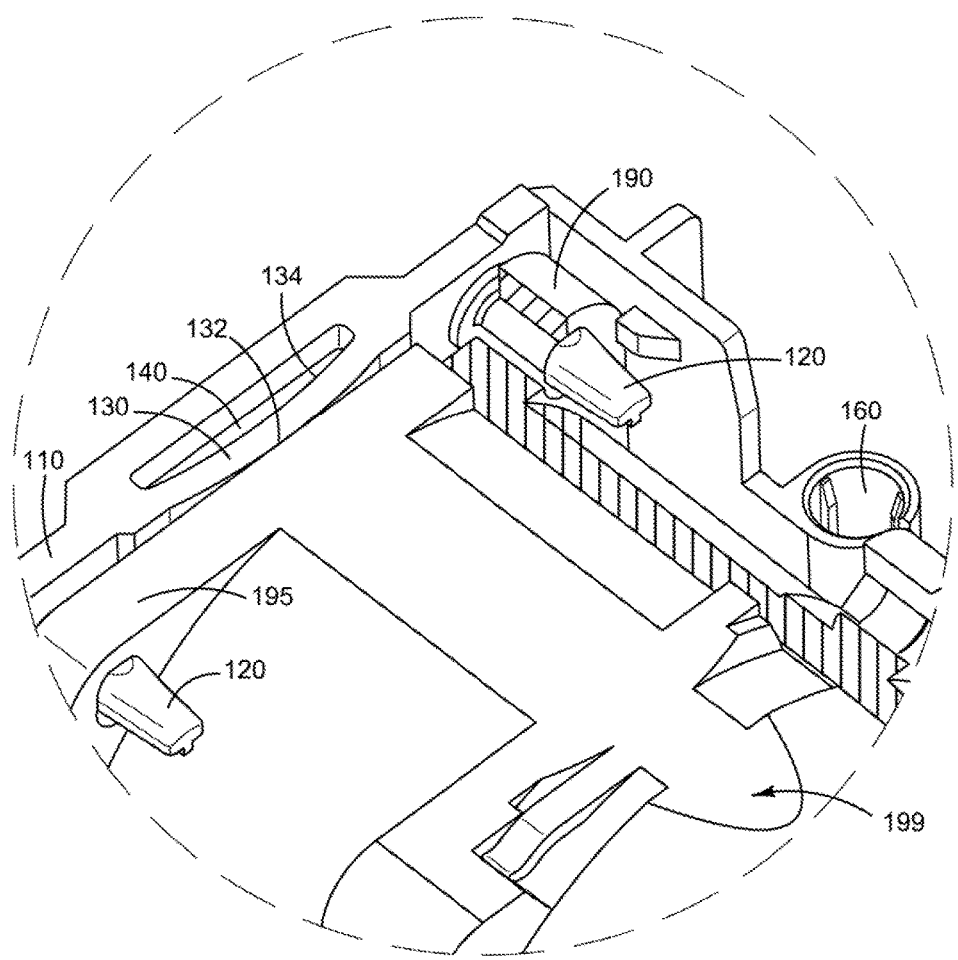
FIG. 2 illustrates another angled view of a fan guard, according to an example.

FIG. 2 illustrates another angled view of the fan guard, according to an example. The fan guard depicted in FIG. 2 is illustrated in an engaged position to facilitate showing components of the fan guard and how the fan guard securely engages fan 199. As above, the fan guard includes a frame 110, and a plurality of snaps 120 that are engaged through snap receivers 190 built into flange 195 of fan 199. Here flexible member 130 is illustrated in a compressed position as it is in contact with flange 195. Flexible member 130 has the form of a curved member with a convex outer surface 132 in contact with flange 195, and a concave inner surface 134. Concave inner surface 134 and frame 110 form a space 140 there between. When in contact with flange 194, flexible member 130 compresses into space 140. Between snaps 120 and flexible member 130, pressure is maintained in opposite directions that ensure secure connection of frame 110 and fan 199. This view of frame HO also shows the pin receiver 160 that may be used to secure frame 110 and fan 199 to a chassis 166 that fan 199 will provide air cooling.

Figure 3:
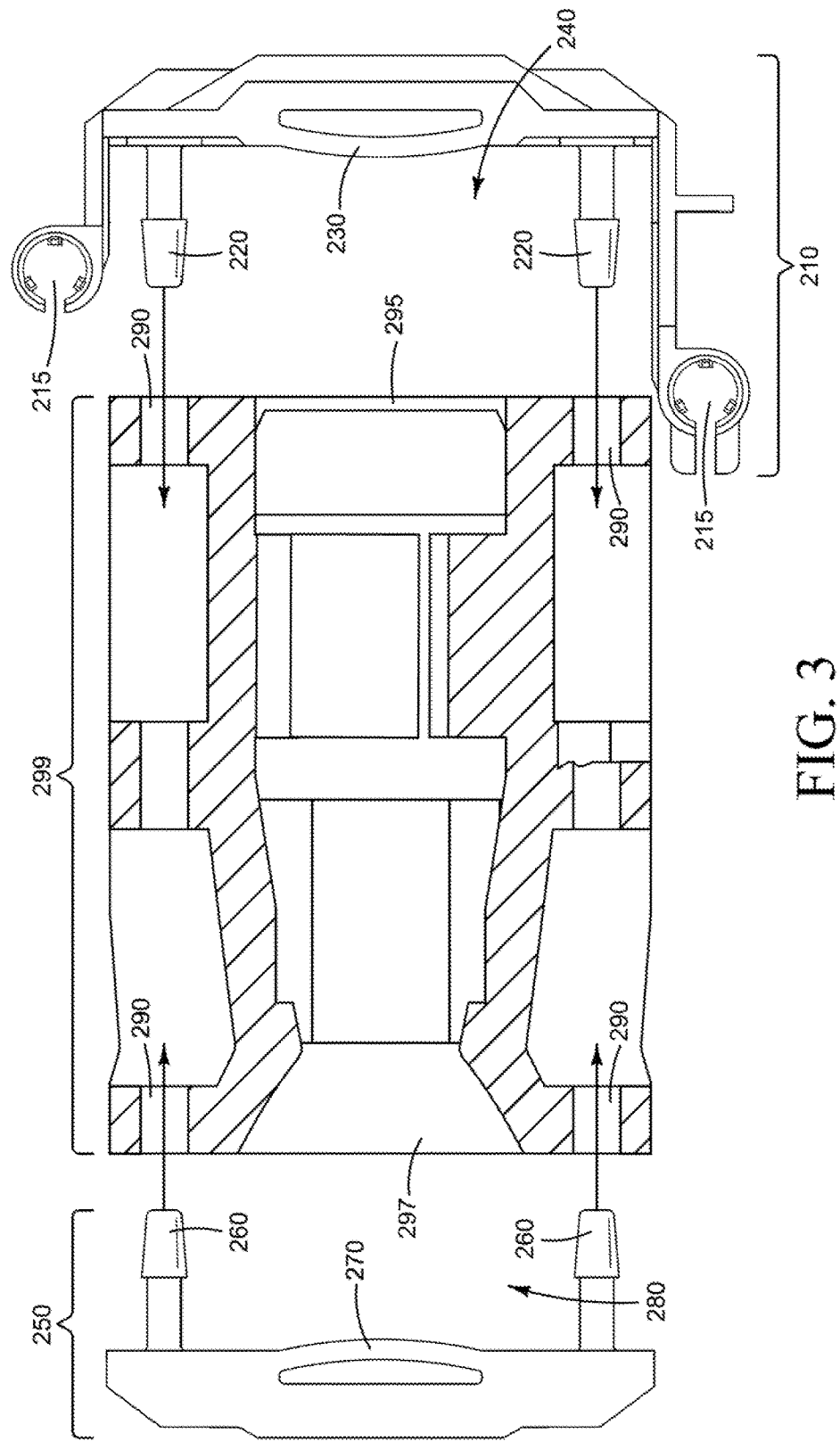
FIG. 3 illustrates a top view of a fan guard, according to an example.

FIG. 3 illustrates a top down view of a fan guard, according to an example. In this example, the fan guard includes a first frame 210 and a second frame 250. In FIG. 3, frames 210 and 250 are illustrated in a disengaged position to facilitate identifying components of frames 210 and 250 and how the components interact with components of fan 299.

First frame 210 removably connects to a first side of fan 299. Specifically, first flange 295 of fan 299 is received by first flange receiving region 240 of frame 210. First flange receiving region 240 is disposed between a first set of flexible members 230 and outward ends of a first set of snaps 220. First frame 210 also includes the first set of snaps 220. First set of snaps 220 engages with snap receivers 290 on the first side of fan 299. In this example, the snap receivers 290 are built into first flange 295. First frame 210 also includes the first set of flexible members 230. First set of flexible members 230 extend in a first outward direction from first frame 210.

To securely attach first frame 210 to fan 299, first set of snaps 220 and first set of flexible members 230 work in concert to apply pressure to first flange 295 in opposite directions. This may prevent, for example, fan 299 from rattling during operation of fan 299. Consequently, first flange receiving region 240 of first frame 210 adjusts in size corresponding to how much members of the first set of flexible members 230 compress when first flange 295 is secured to first frame 210. First frame 210 also includes a plurality of pin receivers 215. The pin receivers (e.g., the pin receivers 160) are disposed opposite each other on frame 210 and may facilitate securing frame 210 and fan 299 to a chassis (e.g., the chassis 166) to be air cooled by fan 299. In various examples, frame 210 may also include an electrical connector housing (not shown) to couple to an electrical connector. This may facilitate, for example, powering fan 299, controlling operation of fan 299, and so forth.

Similar to first frame 210, second frame 250 removably connects to a second side of fan 299. Specifically, second flange 297 of fan 299 is received by second flange receiving region 280 of frame 250. Second flange receiving region 280 is disposed between a first set of flexible members 270 and outward ends of a first set of snaps 260. Second frame 250 also includes the second set of snaps 260. Second set of snaps 260 engages with snap receivers 290 on the second side of fan 299, In this example, the snap receivers 290 are built into second flange 297. Second frame 250 also includes the second set of flexible members 270. Second set of flexible members 270 extend in a second outward direction from second frame 250.

To securely attach second frame 250 to fan 299, second set of snaps 260 and second set of flexible members 270 work in concert to apply pressure to second flange 297 in opposite directions. This may prevent, for example, fan 299 from rattling during operation of fan 299. Consequently, second flange receiving region 280 of second frame 250 adjusts in size corresponding to how much members of the second set of flexible members 270 compress when second flange 297 is secured to second frame 250.

Figure 4:
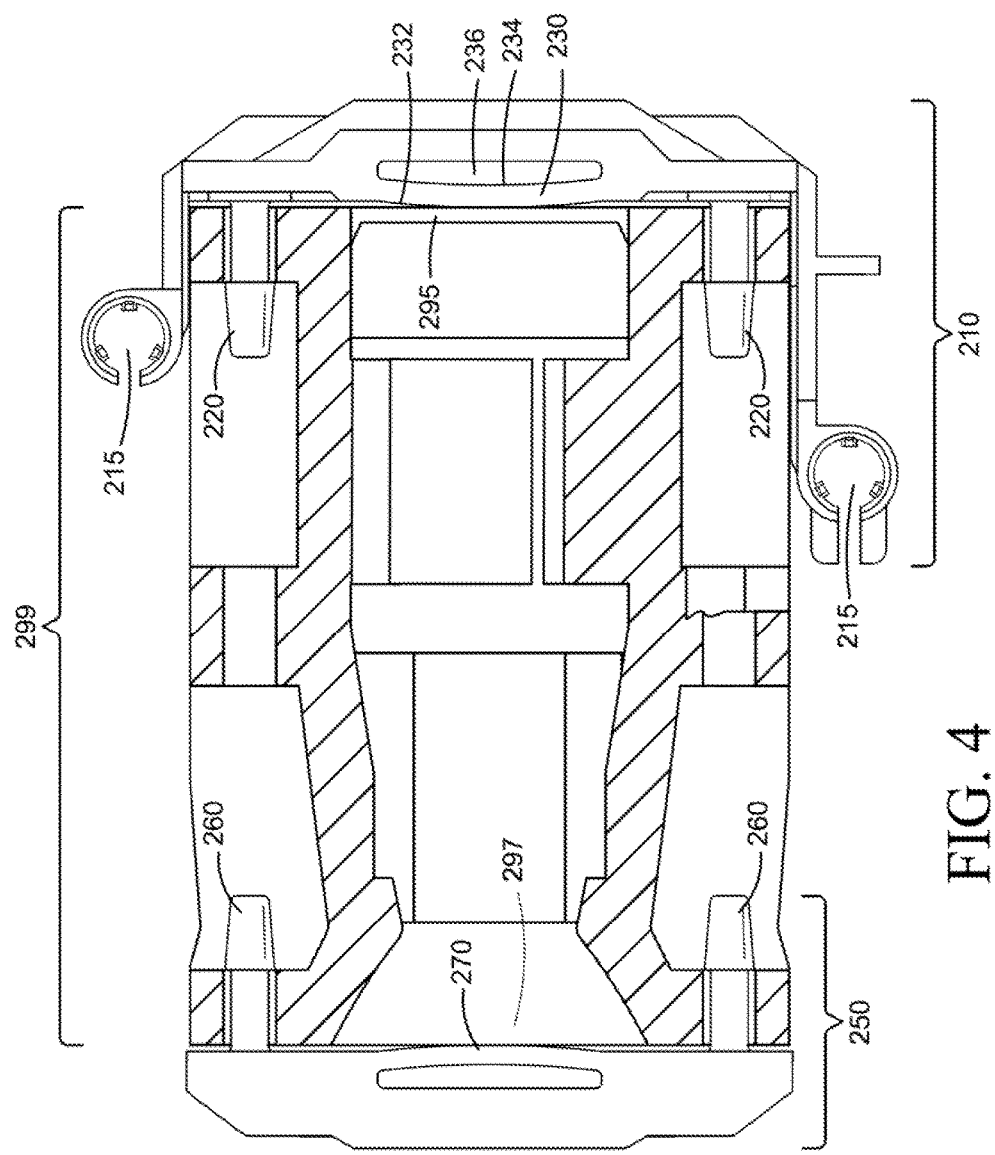
FIG. 4 illustrates another top view of a fan guard, according to an example.

FIG. 4 illustrates another top down view of a fan guard, according to an example. The fan guard depicted in FIG. 4 is illustrated in an engaged position to facilitate showing components of the fan guard and how the fan guard securely engages fan 299. As above, the fan guard includes a first frame 210 having a first set of snaps 220, a first set of flexible members 230, and a first flange receiving region (not labeled). First set of flexible members 230 may include a plurality of curved members. Each curved member has a convex outer surface 232 that engages with a first flange 295 of fan 299. The curved members also have a concave inner surface 234. The concave inner surface 234 and frame 210 form a space 236 there between. During engagement of concave outer surface 232 and first flange 295, the curved member may compress into space 236, thereby applying pressure to first flange 295 in combination with first set of snaps 220 First frames 210 also include a plurality of pin receivers 215 for connecting frame 210 and fan 299 to a chassis (e.g., the chassis 166) to which fan 299 will provide air cooling.

The fan guard also includes a second frame 250 having a second set of snaps 260, a second set of flexible members 270 and a second flange receiving region (not labeled). Similar to first set of flexible members 230, second set of flexible members 270 may be curved members having convex outer surfaces and concave inner surfaces. These curved members may form a space into which second set of flexible members 270 may compress when engaged with a second flange 297 of fan 299.

It is appreciated that the previous description of the disclosed examples is provided to enable any person skilled in the art to make or use the present disclosure. Various modifications to these examples will be readily apparent to those skilled in the art, and the generic principles defined herein may be applied to other examples without departing from the spirit or scope of the disclosure. Thus, the present disclosure is not intended to be limited to the examples shown herein but is to be accorded the widest scope consistent with the principles and novel features disclosed herein.

What is claimed is:

1. A fan guard device usable with a fan, the fan guard device comprising:
   a frame including a flange receiving region to receive the fan;
   a plurality of snaps extending in a first direction from the frame into the flange receiving region to engage the fan and couple the frame to a flange of the fan to apply a first pressure in a second direction;
   a plurality of elongated cylindrical pin receivers to couple the frame to a chassis, wherein the plurality of elongated cylindrical pin receivers are oriented perpendicular to the plurality of snaps extending in the first direction and positioned opposite each other with the flange receiving region disposed therebetween, and wherein the cylindrical pin receivers and the plurality of snaps are integrated with the flange receiving region of the frame; and
   a flexible member formed from the frame and protruding from the frame to engage the flange of the fan and apply a second pressure in the first direction the flexible member being compressible to accommodate a range of flange thicknesses of the fan.

2. The fan guard device of claim 1, where the flexible member is curved.

3. The fan guard device of claim 1, where the flexible member comprises:
   a convex outer surface; and
   a concave inner surface.

4. The fan guard device of claim 3, where the concave inner surface and the frame form a space therebetween for the flexible member to move into during compression thereof.

5. The fan guard device of claim 4, where the space formed is enclosed by the concave inner surface of the at least on flexible member and the frame.

6. The fan guard device of claim 1, where the amount of compression of the flexible member corresponds to the thickness of the flange of the fan when coupled to the fan guard by the plurality of snaps.

7. The fan guard device of claim 1, wherein the fan guard forms the flange receiving region to receive the flange, where the flange receiving region adjusts in size based on compression of the flexible member.

8. The fan guard device of claim 1, further comprising a second flexible member.

9. The fan guard device of claim 1, wherein the plurality of elongated cylindrical pin receivers are disposed opposite each other with a space in which the fan is to be located interposed therebetween and a length of the plurality of elongated cylindrical pin receivers comprises a gap therethrough.

10. The fan guard device of claim 1, where the frame further comprises an electrical connector housing to couple to an electrical connector.

11. A system, comprising:
a first frame including a first flange receiving region to removably connect to one side of a fan, the first frame comprising:
  a first set of snaps extending in a first direction to couple the first frame to a first flange of the fan to apply a first pressure in a second direction;
  a plurality of elongated cylindrical pin receivers to couple the first frame to a chassis, wherein the plurality of elongated cylindrical pin receivers are oriented perpendicular to the plurality of snaps extending in the first direction and positioned opposite each other with the first flange receiving region disposed therebetween, and wherein the cylindrical pin receivers and the plurality of snaps are integrated with the first flange receiving region of the frame;
  a first set of flexible members formed from the first frame and protruding from the first frame to contact the first flange and to apply a second pressure in the first direction; and
  the first flange receiving region formed by a fan guard to receive the first flange of the fan, where the first flange receiving region adjusts in size corresponding to the first pressure of the first set of snaps and the second pressure of the first set of flexible members, and
a second frame to removably connect to another side of the fan, the second frame comprising:
  a second set of snaps extending in the second direction to couple the second frame to a second flange of the fan to apply a third pressure in the first direction;
  a second set of flexible members formed from the second frame and protruding from the second frame to contact the second flange and apply a fourth pressure in the second direction; and
  a second flange receiving region formed by the fan guard to receive the second flange of the fan, where the second flange receiving region adjusts in size corresponding to the third pressure of the second set of snaps and the fourth pressure of the second set of flexible members.

12. The fan guard system of claim 11, where the first set of flexible members comprises a plurality of curved members, each curved member including a convex outer surface and a concave inner surface, where the concave inner surface and the frame form a space therebetween for the respective curved member to move into during compression thereof.

13. The fan guard system of claim 11, where the first flange receiving region is disposed between the first set of flexible members and outward ends of the first set of snaps and the second flange receiving region is disposed between the flexible member and outward ends of the second set of snaps.

14. The fan guard system of claim 11, where the plurality of elongated cylindrical pin receivers are disposed opposite each other with a space in which the fan is to be located interposed therebetween.

15. The fan guard system of claim 11, where the first frame further comprises an electrical connector housing to couple to an electrical connector.

16. A fan guard device, comprising:
a frame including a flange receiving region to receive a fan;
a plurality of snaps that extend in a first direction from the frame into the flange receiving region;
a plurality of elongated cylindrical pin receivers formed by the frame to connect the frame and the fan to a chassis, wherein the plurality of elongated cylindrical pin receivers form edges of the flange receiving region and are oriented perpendicular to the plurality of snaps extending in the first direction, and wherein the plurality of elongated cylindrical pin receivers are positioned opposite each other with the flange receiving region disposed therebetween, and wherein the cylindrical pin receivers and the plurality of snaps are integrated with the flange receiving region of the frame;
a flexible member extending in the first direction into the flange receiving region to engage a flange of the fan; and
an electrical connector housing formed by the frame.

17. The fan guard device of claim 16, where the plurality of elongated cylindrical pin receivers are disposed opposite each other with a space in which the fan is to be located interposed therebetween.

18. The fan guard device of claim 17, where the plurality of elongated cylindrical pin receivers are to couple the fan and the frame to corresponding pins in the chassis.

19. The fan guard device of claim 16, where the electrical connector housing is formed outside of the flange receiving region.

20. The fan guard device of claim 16, where respective longitudinal axes of the plurality of elongated cylindrical pin receivers extend in a second direction perpendicular to the first direction, wherein a first end of each elongated cylindrical pin receiver couples to the chassis and a second end of each of the elongated pin receivers does not couple to the chassis.

* * * * *